United States Patent [19]
Chiang et al.

[11] Patent Number: 6,143,604
[45] Date of Patent: Nov. 7, 2000

[54] METHOD FOR FABRICATING SMALL-SIZE TWO-STEP CONTACTS FOR WORD-LINE STRAPPING ON DYNAMIC RANDOM ACCESS MEMORY (DRAM)

[75] Inventors: Ming-Hsiung Chiang, Taipei; Wen-Chuan Chiang, Hsin-Chu; Cheng-Ming Wu, Kao-Hsiung, all of Taiwan

[73] Assignee: Taiwan Semiconductor Manufacturing Company, Hsin-Chu, Taiwan

[21] Appl. No.: 09/325,956

[22] Filed: Jun. 4, 1999

[51] Int. Cl.[7] .............................................. H01L 21/8242
[52] U.S. Cl. .......................................... 438/253; 438/210
[58] Field of Search ................................... 438/210, 241, 438/253, 256, 396, 399

[56] References Cited

U.S. PATENT DOCUMENTS

| | | | |
|---|---|---|---|
| 4,811,076 | 3/1989 | Tigelaar et al. | 357/51 |
| 5,565,372 | 10/1996 | Kim | 437/52 |
| 5,620,917 | 4/1997 | Yoon et al. | 438/253 |
| 5,668,036 | 9/1997 | Sune | 438/253 |
| 5,683,938 | 11/1997 | Kim et al. | 437/192 |
| 5,792,680 | 8/1998 | Sung et al. | 438/210 |
| 6,004,839 | 12/1999 | Hayashi et al. | 438/253 |

*Primary Examiner*—Chandra Chaudhari
*Attorney, Agent, or Firm*—George O. Saile; Stephen B. Ackerman

[57] ABSTRACT

A method using a two-step contact process for making word-line strapping on DRAM devices was achieved. The method replaces a single-step contact process in which it is difficult to etch the smaller contact openings. After partially completing the DRAM cells by forming gate electrodes and word lines having a first hard mask, a planar first insulating layer is formed. Capacitor node contact openings are etched and capacitors with a protective second hard mask are completed. A thin first photoresist mask with improved resolution is used to etch small first contact openings in the first insulating layer to the word lines, while the second hard mask protects the capacitors from etching. Tungsten plugs are formed in the openings, and an interlevel dielectric layer is deposited over the capacitors. A thin second photoresist mask with improved resolution is used to etch second contact openings to the tungsten plugs. The word-line strapping for the DRAM is completed by forming tungsten plugs in the second contact openings. Since the tungsten plugs are formed after forming the capacitors, they are not subjected to high-temperature processing that could adversely affect the DRAM devices. The two thin photoresist masks replacing a thicker photoresist mask used in the single-step process allow smaller contact openings to be etched.

30 Claims, 4 Drawing Sheets

METHOD FOR FABRICATING SMALL-SIZE TWO-STEP CONTACTS FOR WORD-LINE STRAPPING ON DYNAMIC RANDOM ACCESS MEMORY (DRAM)

BACKGROUND OF THE INVENTION

1. Field of the Invention

This invention relates to integrated circuit semiconductor devices, and more particularly to a method for fabricating dynamic random access memory (DRAM) devices having two-step contacts to word lines, commonly referred to as word-line strapping. This new two-step contact process replaces a single-step high-aspect-ratio contact opening, which is difficult to fabricate in high-density circuits as lateral dimensions on integrated circuits continue to decrease, and more specifically for word-line contacts on DRAMs.

2. Description of the Prior Art

As integrated circuit density increases, it becomes increasing difficult to manufacture ultra large scale integrated (ULSI) circuits. One of the problems associated with making these dense circuits is the increase in the number of material layers that requires etching high-aspect-ratio features in these underlying layers. One area of concern is the multilevel contact openings that must be etched to wire up the semiconductor devices on an integrated circuit. One area where this is of particular concern is the word-line strapping used to electrically connect the word lines in the memory cells to other parts of the circuit, such as the peripheral circuits on the DRAM chip. A stacked capacitor DRAM device in which the capacitor is formed over the device area results in several insulating layers having a cumulative thick insulating layer. Because of the thermal considerations, it is desirable to form the word-line metal contacts after forming the capacitors by high-temperature processing. Unfortunately, as the lateral dimensions decrease, it becomes increasingly difficult to etch small contact openings with high aspect ratios in the cumulatively thick insulating layer to the word line for word-line strapping. To etch high-aspect-ratio contacts, it is necessary to use a relatively thick photoresist as an etch mask, which is difficult to expose and develop with high resolution.

Several methods of making electrical contacts on integrated circuits, including DRAM circuits, have been described in the prior art. For example, Yoon et al. U.S. Pat. No. 5,620,917, teach a method for making a semiconductor memory device having a capacitor and contacts to the peripheral circuit regions without affecting the step difference between the memory cell and the peripheral circuit region when the storage electrodes are made thicker. Kim, U.S. Pat. No. 5,565,372, teaches a method for making self-aligned bit-line contacts to a semiconductor device in which a conductive layer is formed between the word line and bit line to minimize capacitor coupling between the word line and bit line. In U.S. Pat. No. 5,792,680 Sung et al. describe a method of forming low-cost DRAM cells on a substrate that has twin (P and N) wells, which requires etching high-aspect-ratio contacts in a thick insulating layer to source/drain areas in the N-well area. Tigelaar et al., U.S. Pat. No. 4,811,076, teach a method for making devices with double capacitors in which a metal interconnect layer is formed to provide ohmic contacts to silicide, silicon, and titanium nitride while providing a top plate for the double capacitors. Kim et al., U.S. Pat. No. 5,683,938, teach a method for filling contact holes with metal by a two-step deposition. However, Kim et al. do not describe a method for making a two-step contact on a DRAM device that has stacked capacitors.

Therefore there is still a need in the semiconductor industry to form high-aspect-ratio contact openings having small sizes in multilevels of insulating layers for word-line strapping on DRAM devices.

SUMMARY OF THE INVENTION

It is a principal object of the present invention to form improved word-line strapping on dynamic random access memory (DRAM) using a two-step contact process that replaces a single-step contact process. The present invention uses two thin photoresist masks that replace one thick photoresist mask in which it is difficult to form high-resolution images for contact openings.

It is another object of the present invention to use a hard mask to protect the capacitors from erosion while the first contact openings are etched using a thin first photoresist mask. A relatively thin second photoresist mask is then used to etch second contact openings over and to conducting plugs in the first contact openings.

A further objective of the present invention is to integrate this two-step contact process into the DRAM process to provide a cost-effective manufacturing process.

In this invention a method is described for fabricating small-size contacts (word-line strapping) on DRAM devices using a two-step contact process. The method begins by providing a semiconductor substrate. Typically the substrate is a P$^-$ doped single-crystal silicon having a <100> crystallographic orientation. A relatively thick Field OXide (FOX) is formed that surrounds and electrically isolates device areas in and on the substrate for the DRAM memory cells. One conventional method of forming the field oxide areas is by a shallow trench isolation (STI) method, as commonly practiced in the industry. The FETs are formed next by growing a thin gate oxide on the device areas. An N$^+$ doped first polysilicon layer is deposited on the substrate. A first hard mask layer, such as silicon nitride ($Si_3N_4$), is deposited on the first polysilicon layer and is patterned to form FET gate electrodes over the device areas and to form word lines over the field oxide areas. The FETs include lightly doped ion-implanted source/drain areas adjacent to the gate electrodes, sidewall spacers on the gate electrodes, and source/drain contact areas formed from a second ion implantation. A first insulating layer, such as silicon oxide ($SiO_2$), is deposited on the substrate and over the FETs, and is planarized. Capacitor node contact openings are etched in the first insulating layer to the source/drain contact areas. A second polysilicon layer is deposited by chemical vapor deposition and is in-situ doped with an N$^+$ dopant, such as phosphorus. The second polysilicon layer is then polished back to form polysilicon plugs in the capacitor node contact openings. A third polysilicon layer is deposited, that is doped N$^+$, and is patterned to form capacitor bottom electrodes over and contacting the polysilicon plugs. A thin interelectrode dielectric layer having a high dielectric constant is formed on the bottom electrodes. A conformal doped fourth polysilicon layer, a conformal second insulating layer, and a conformal second hard-mask layer are deposited over the capacitor bottom electrodes. The second hard-mask layer, the second insulating layer, and the doped fourth polysilicon layer are patterned to form capacitor top electrodes from the fourth polysilicon layer and having the protective second hard-mask layer on their top surfaces, while exposing the first insulating layer over the word lines on the field oxide areas. Because of the protective second hard-mask layer, a thin first photoresist mask can be used to provide high resolution patterns for etching small first contact openings in the first insulating layer to the first hard-mask layer over the word lines. The second hard-mask layer protects the capacitors from unwanted etching when the small first contact openings are anisotropically plasma etched and when the thin photoresist is eroded over the capacitors during the etching. The first hard-mask layer in the first contact openings is etched to the polysilicon word lines, while the second hard-mask layer is etched selectively to the second insulating layer over the capacitors. After removing the remaining portions of the first photoresist mask, a barrier layer and a tungsten layer are deposited and etched back to the first insulating layer to form first conducting plugs in the first contact openings. A third insulating layer is deposited and planarized over the capacitors to form an interlevel dielectric (ILD) layer. Using a second photoresist mask and anisotropic plasma etching second contact openings are etched in the third insulating layer over and to the tungsten first conducting plugs. Since the second contact openings are not etched as deep as the prior-art single-step process, a thinner photoresist mask can be used to etch smaller second contact openings because of the reduced aspect ratio. A second conducting layer, such as tungsten, is deposited and polished back to forming second conducting plugs in the second contact openings to complete the electrical contacts (wordline strapping) for the DRAMs.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The method for making two-step contacts for word-line strapping on DRAM devices is now described in detail. The process for making these two-step contacts replaces a traditional one-step contact, which becomes increasingly difficult to form as the circuit density increases and the contact width decreases resulting in high-aspect ratio contacts. Although the process is described for making memory cells for DRAM devices having N-channel FETs as the access transistors, it should also be well understood by one skilled in the art that by including additional process steps, in addition to those described in this embodiment, other types of devices can be included on the DRAM chip. For example, by forming N-well regions in a P-doped substrate, P-channel FETs can also be provided and Complementary Metal-Oxide-Semiconductor (CMOS) circuits can be formed therefrom, such as are required for the peripheral circuits on the DRAM chip. The word-line strapping allows the word lines to be electrically connected to the peripheral circuits.

Figure 1:
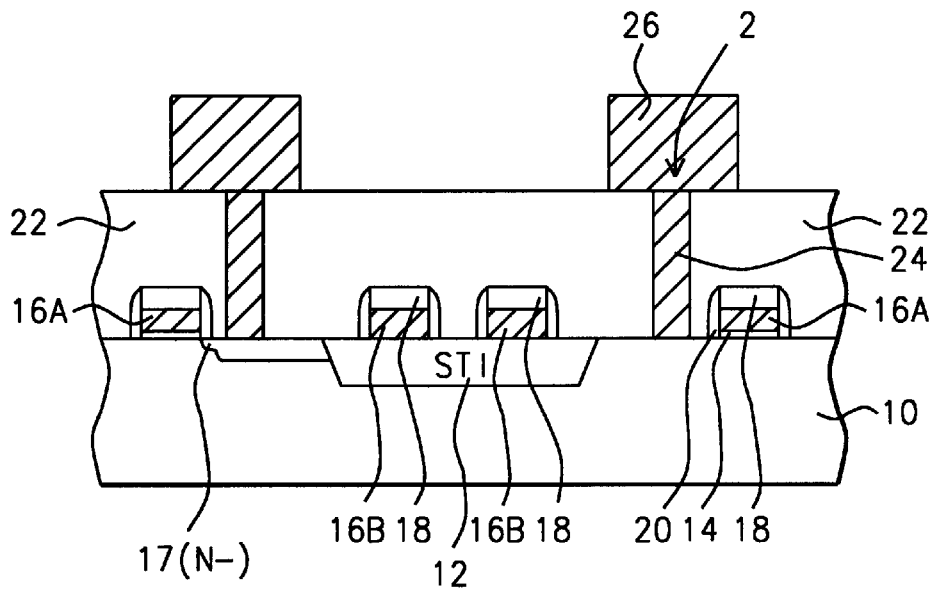
FIGS. 1 through 7 are schematic cross-sectional views for the sequence of process steps for making a two-step contact for word-line strapping on DRAM devices.

Referring to FIG. 1, the method begins by providing a semiconductor substrate 10, a portion of which is shown in the Fig., and having a partially completed memory cell. Typically the substrate is a $P^-$ doped single-crystal silicon having a <100> crystallographic orientation. Field OXide (FOX) regions 12 are formed surrounding and electrically isolating the device areas. A portion of the FOX 12 between two memory cell device areas is depicted in the Fig. One conventional method of forming the field oxide regions is by using a shallow trench isolation (STI) method, as commonly practiced in the industry. Generally the STI is formed by etching trenches in the field oxide regions on the substrate to a depth of between about 3000 and 4500 Angstroms. After forming a thin thermal oxide in the trenches, the trenches are filled with an insulating material such a chemical-vapor-deposited $SiO_2$, and are made planar with the surface of the substrate 10, for example, by using a planarizing etchback or chemical/mechanical polishing (CMP). Next, a thin gate oxide 14 of about 50 to 70 Angstroms is grown on the device areas. The FET gate electrodes are then formed by depositing an $N^+$ doped polysilicon layer 16, for example by low-pressure chemical vapor deposition (LPCVD), and is typically deposited to a thickness of between about 750 and 1250 Angstroms. A refractory metal silicide layer (not shown), such as tungsten silicide ($WSi_2$), can be deposited by LPCVD to reduce the sheet resistance and to improve circuit performance.

Still referring to FIG. 1, a first hard-mask layer 18 is deposited on the first polysilicon layer 16. Layer 18 is preferably silicon nitride ($Si_3N_4$), and is deposited by LPCVD to a thickness of between about 1500 and 2500 Angstroms. The hard-mask layer 18 and the first polysilicon layer 16 are patterned using conventional photolithographic techniques and anisotropic plasma etching to form FET gate electrodes 16A over the device areas and to form word lines 16B over the FOX areas 12. As commonly practiced in the industry, lightly doped source/drain areas $17(N^-)$ are formed adjacent to the gate electrodes 16A by ion implanting a dopant such as arsenic ($As^{75}$) or phosphorus ($P^{31}$). Next, sidewall spacers 20 are formed on the sidewalls of the gate electrodes 16A by depositing a conformal insulating material, such as $SiO_2$ and/or $Si_3N_4$, and anisotropically etching back. The FETs are now completed by using a second ion implantation to form heavily doped source/drain contact areas $19(N^+)$ adjacent to the sidewall spacers 20. The source/drain contact areas are typically doped with As or P to a dopant concentration of between about 1.0 E 19 and 1.0 E 20 atoms/cm$^3$.

Continuing with FIG. 1, a first insulating layer 22 is deposited on the substrate and over the FETs. Layer 22 is preferably $SiO_2$ deposited by LPCVD using tetraethosiloxane (TEOS) as the reactant gas. Layer 22 is then planarized using, for example, chemical/mechanical polishing (CMP) to have a thickness of between about 2000 and 3000 Angstroms over the gate electrodes 16A and over the word lines 16B. Alternatively, the first insulating layer 22 can include a doped $SiO_2$ such as borophosphosilicate glass (BPSG), which is also deposited by LPCVD using TEOS, and which is doped in situ with boron and phosphorus. The BPSG is planarized by thermal reflow or by CMP. Next, capacitor node contact openings 2 are etched in the first insulating layer 22 to the source/drain contact areas 19 using conventional photolithographic techniques and anisotropic plasma etching. The etching can be carried out in a high-density-plasma (HDP) etcher using an etchant gas such as $CH_2F_2$, $O_2$, and Ar, which has a high etch selectivity of $SiO_2$ to silicon. A second polysilicon layer 24 is deposited by LPCVD sufficiently thick to fill the openings 2, and is in-situ doped with an $N^+$ dopant, such as phosphorus, to a concentration of between about 1.0 E 18 and 1.0 E 20 atoms/cm$^3$. The second polysilicon layer is then polished back, such as by CMP, to form polysilicon plugs 24 in the capacitor node contact openings 2. Capacitor bottom electrodes are formed next by depositing a third polysilicon layer 26 to a thickness of between about 1000 and 2000 Angstroms. The third polysilicon layer 26 is doped $N^+$ with P to a concentration of between about 1.0 E 20 and 1.0 E 21 atoms/cm$^3$. The third polysilicon layer is then patterned to form the bottom electrodes 26 over and contacting the polysilicon plugs 24. Alternatively, by including additional processing steps, the bottom electrodes 26 can be patterned to increase the area by forming capacitors of various shapes such as crown-shaped, fin-shaped, and others. Another preferred method is to roughen the surface of the bottom electrodes by forming hemispherical-shaped-grain (HSG) polysilicon on the bottom electrode surface by depositing a thin amorphous silicon layer and annealing at a temperature of about 800° C.

Figure 2:
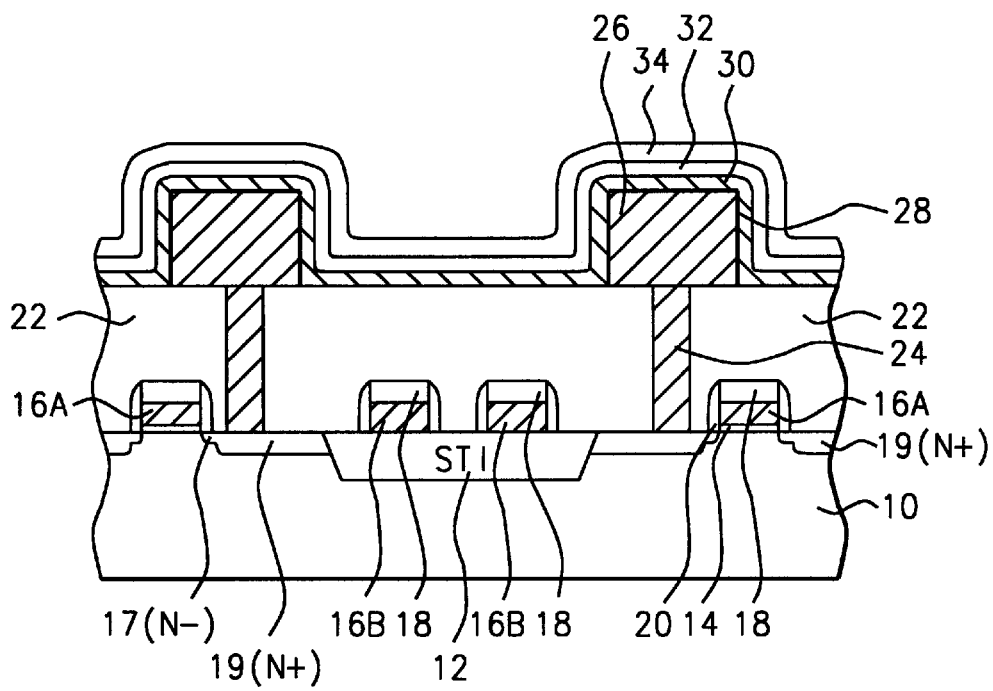

Referring next to FIG. 2, a thin interelectrode dielectric layer 28, having a high dielectric constant, is formed on the capacitor bottom electrodes 26. The dielectric layer 28 is preferably composed of layers of $SiO_2/Si_3N_4/SiO_2$ (ONO). The ONO dielectric layer can be formed by growing a thermal oxide on the polysilicon bottom electrodes 26, depositing a $Si_3N_4$ layer by LPCVD, and then using an oxidation furnace to partially reduce the $Si_3N_4$ layer to form a top $SiO_2$ layer. Preferably the ONO is formed to a thickness of between about 50 and 55 Angstroms. Alternatively, the dielectric layer 28 can be other high-dielectric-constant materials, such as tantalum pentoxide ($Ta_2O_5$) or can be used in conjunction with ONO to form the high-dielectric-constant layer 28.

Continuing with FIG. 2, a conformal $N^+$ doped fourth polysilicon layer 30 is deposited by LPCVD to a thickness of between about 750 and 1250 Angstroms over the dielectric layer 28. Now, a key feature of this invention, a conformal second insulating layer 32 and a conformal second hard-mask layer 34 are deposited over the fourth polysilicon layer 30. Preferably the second insulating layer 32 is $SiO_2$, deposited by LPCVD to a thickness of between about 1500 and 2500 Angstroms, and the second hard-mask layer 34 is $Si_3N_4$, also deposited by LPCVD, and to a thickness of between about 1500 and 2500 Angstroms.

Figure 3:
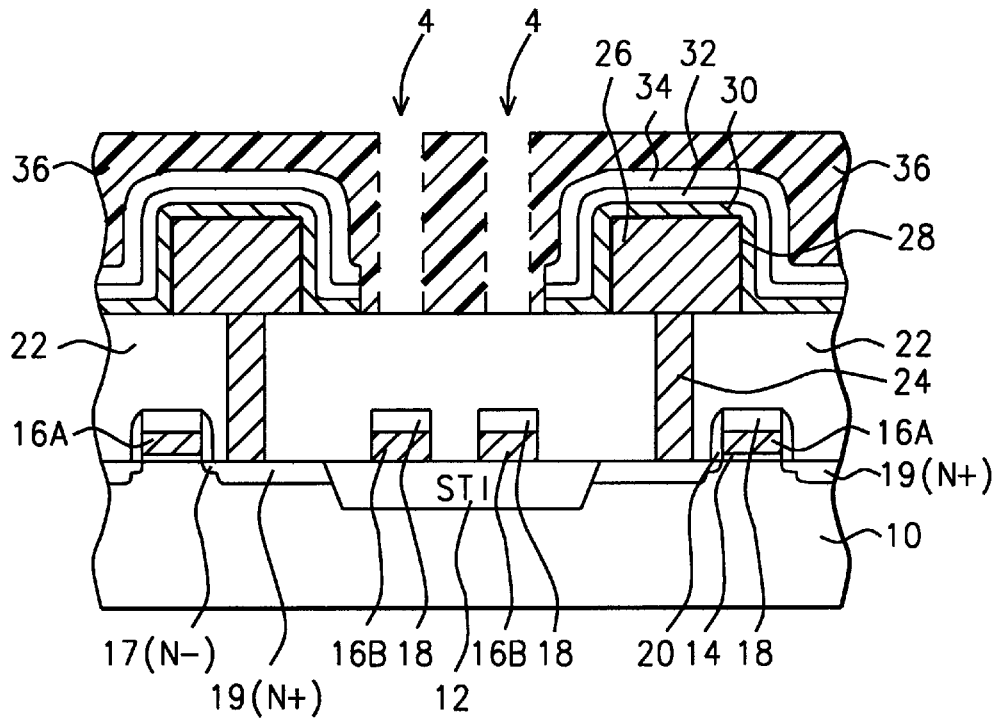

Referring to FIG. 3, conventional photolithographic techniques and anisotropic plasma etching are used to pattern the second hard-mask layer 34, the second insulating layer 32, and the fourth polysilicon layer 30 to form capacitor top electrodes 30 from the fourth polysilicon layer. Next, a first photoresist layer 36 is deposited by spin coating and is patterned to form small first contact holes (openings) 4 in the first insulating layer 22 to the first hard-mask layer 18 over the word lines 16B. Since the protective second hard-mask layer 34 protects the capacitors from etching, the first photoresist layer 36 can be thin. This allows the exposure and development of very small first openings in the thin photoresist that would otherwise be difficult to achieve in a thicker photoresist used for the single-step contact openings. For example, the first photoresist layer 36 can have a thickness of between about 1.0 and 1.4 micrometers (um), compared to a conventional thicker photoresist having a thickness of about 2.0 um.

Figure 4:
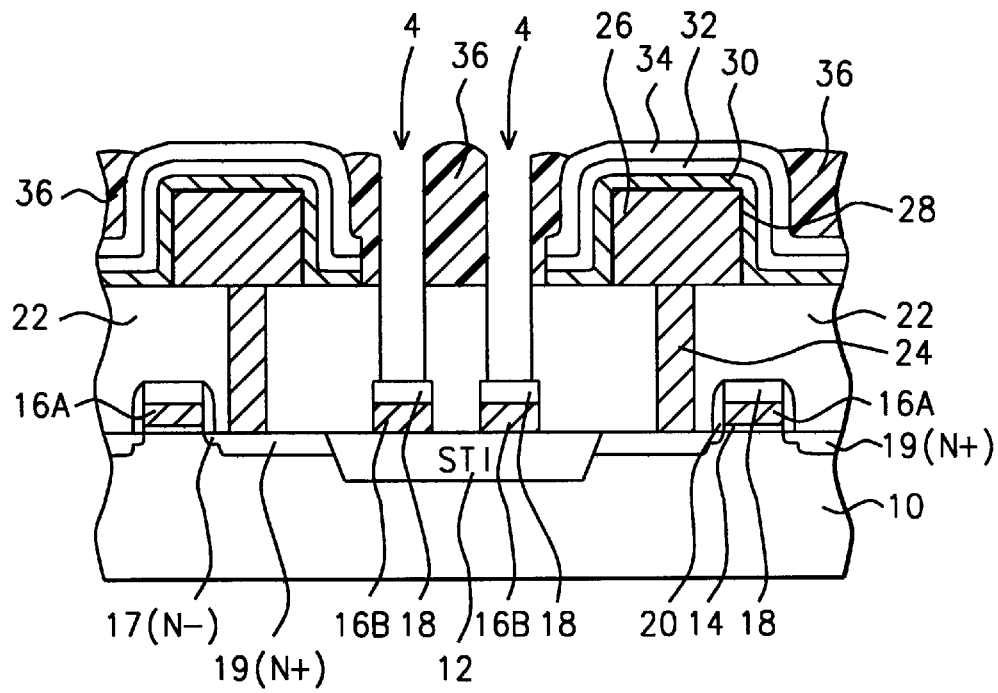

Referring to FIG. 4, the first contact openings 4 for the DRAM word-line strapping are etched in the first insulating layer 22 to the first hard-mask layer 18. The etching is preferably carried out in a HDP etcher using an etchant gas such as $CF_4$, $CHF_3$, and Ar that has an etch-rate selectivity of $SiO_2$ to $Si_3N_4$ of at least greater than 10:1. As shown in the Fig., when the contact openings 4 are etched, the second hard-mask layer 34 protects the capacitors (top electrodes 30) from unwanted etching or erosion when the first photoresist 36 is etched away.

Figure 5:
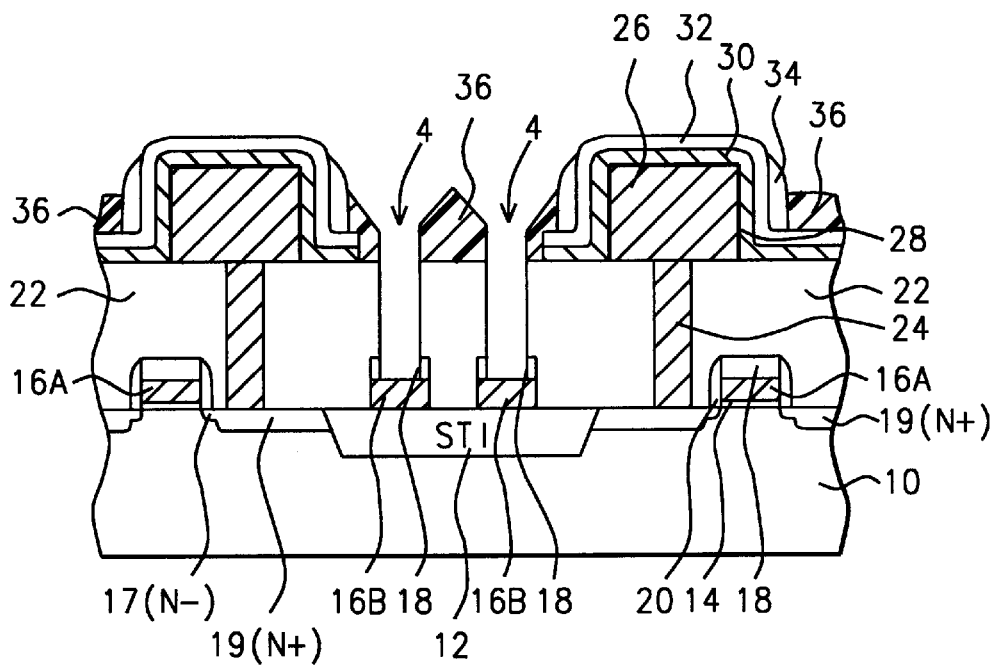

Referring to FIG. 5, with the first photoresist layer 36 still on the wafer, the first hard mask 18 in the openings 4 is etched to the polysilicon word lines 16B, while the second hard-mask layer 34 is etched selectively to the second insulating layer 32 over the capacitors. This etching is preferably carried out in a HDP etcher using an etchant gas such as $CF_4$ and $CHF_3$ that etches $Si_3N_4$ selectively to $SiO_2$, and having an etch-rate selectivity of at least greater than 1:1. The second insulating layer 32 protects the capacitors from unwanted etching when the first hard mask 18 is removed in the openings 4 to provide good electrical contacts. During the anisotropic etching portions of the second hard mask 34 are retained on the sidewalls of the capacitors, as shown in FIG. 5.

Figure 6:
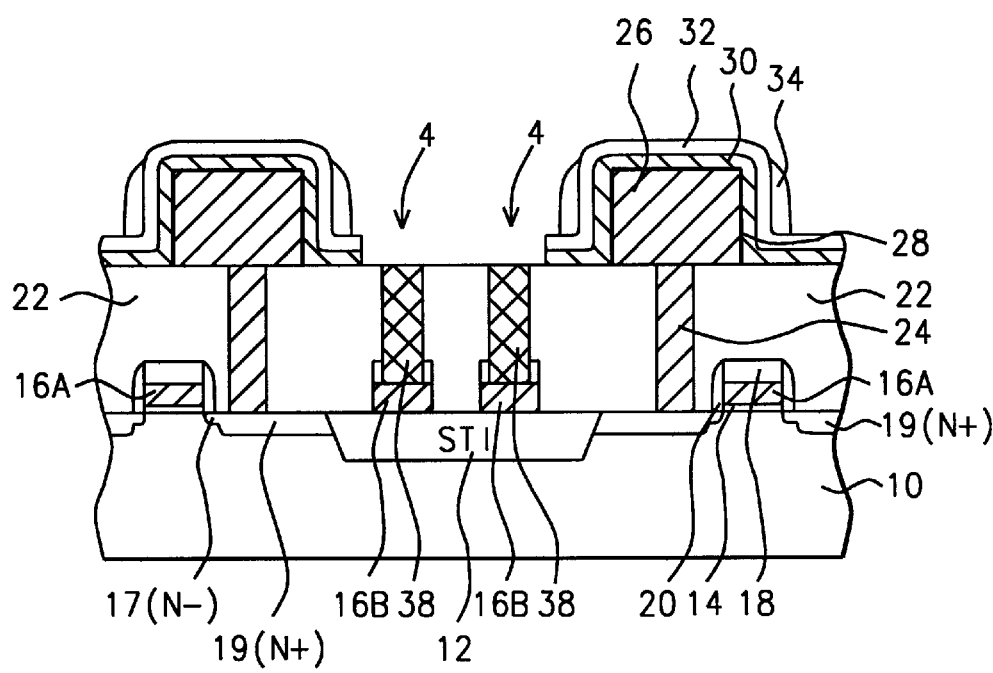

Referring to FIG. 6, after removing the remaining portions of the first photoresist mask, a barrier/adhesion layer (not shown) and a tungsten (W) layer 38 are deposited and etched back to the first insulating layer 22 to form first conducting plugs 38 in the first contact openings 4. The barrier/adhesion layer is preferably composed of titanium/titanium nitride (Ti/TiN) and is typically deposited to a thickness of about 400 to 800 Angstroms. The tungsten layer 38 is deposited by CVD using tungsten hexafluoride as the reactant gas, and is deposited to a thickness sufficient to fill the first contact openings 4. The tungsten layer 38 and the barrier layer are preferably etched back to the first insulating layer 22 using plasma etching and an etchant gas such as sulfur hexafluoride ($SF_6$).

Figure 7:
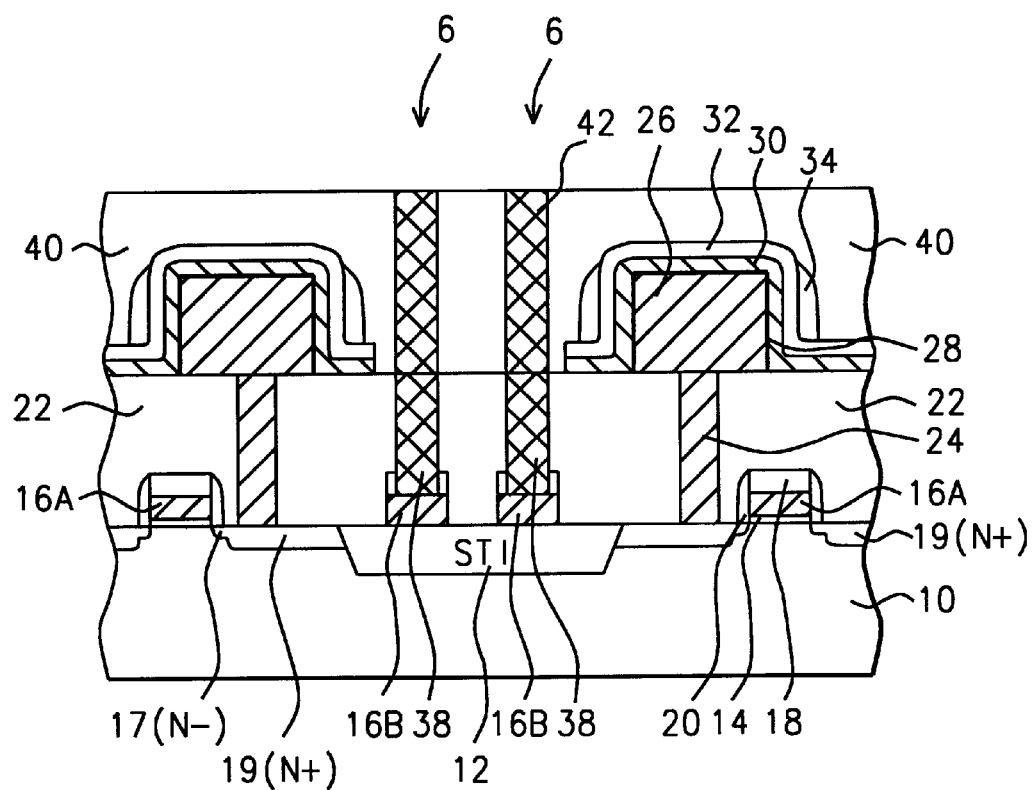

Referring to FIG. 7, a third insulating layer 40, such as $SiO_2$, is deposited and planarized over the capacitors to form an interlevel dielectric (ILD) layer. Layer 40 is deposited by LPCVD using TEOS as the reactant gas. The $SiO_2$ layer 40 is then planarized by CMP to have a thickness of between about 2000 and 4000 Angstroms over the capacitors. Using a second photoresist mask (not shown) and anisotropic plasma etching second contact openings 6 are etched in the third insulating layer 40 over and to the tungsten first conducting plugs 38. Since the second contact openings 6 are not etched as deep as in a prior-art single-step process, a thinner second photoresist mask can also be used to etch smaller second contact openings 6 because of the reduced aspect ratio. The second contact openings 6 are etched similar to the etching of the first contact openings using a HDP etcher or a reactive ion etcher and an etchant gas such as $CH_2F_2$, $O_2$, and Ar.

Still referring to FIG. 7, a second conducting layer 42, preferably tungsten, is deposited sufficiently thick to fill the second contact openings 6. The tungsten layer 42 is then chem/mech polished back to form second conducting plugs 42 in the second contact openings 6 to complete the electrical contacts (word-line strapping) for the DRAMs. By forming the first and second tungsten plugs after forming the capacitors, the tungsten plugs are not subjected to the high temperatures used to form the capacitors. For example, the tungsten plugs are not exposed to the high-temperature annealing (800° C.) to form HSG on the capacitor bottom electrodes, and to the ONO deposition high temperature (about 780° C.).

While the invention has been particularly shown and described with reference to the preferred embodiment thereof, it will be understood by those skilled in the art that various changes in form and details may be made without departing from the spirit and scope of the invention.

What is claimed is:

1. A method for fabricating electrical contacts for dynamic random access memory (DRAM) devices on a semiconductor substrate comprising the steps of:

providing said semiconductor substrate having device areas for memory cells surrounded and electrically isolated from each other by field oxide areas;

depositing a first polysilicon layer on said substrate;

depositing a first hard mask layer on said first polysilicon layer;

patterning said first hard mask layer and said first polysilicon layer to form field effect transistor (FET) gate electrodes over said device areas and to form word lines over said field oxide areas, where said FETs include source/drain areas and sidewall spacers on said gate electrodes;

depositing a first insulating layer on said substrate and over said FETs, and planarizing said first insulating layer;

etching capacitor node contact openings in said first insulating layer to said source/drain areas;

depositing a second polysilicon layer and polishing back to form polysilicon plugs in said capacitor node contact openings;

depositing a third polysilicon layer and patterning to form capacitor bottom electrodes over and contacting said polysilicon plugs;

forming an interelectrode dielectric layer on said bottom electrodes;

depositing a fourth polysilicon layer, a second insulating layer, and a second hard-mask layer;

patterning said second hard-mask layer, said second insulating layer, and said fourth polysilicon layer to form capacitor top electrodes, while exposing said first insulating layer over said word lines on said field oxide areas;

using a first photoresist mask that is sufficiently thin to provide high resolution patterns for etching first contact openings, and using anisotropic plasma etching to etch said first contact openings in said first insulating layer to said first hard mask, while said second hard-mask layer protects said capacitors from etching;

etching said first hard-mask layer in said first contact openings to said word lines, while said second hard-mask layer is etched selectively to said second insulating layer;

removing remaining portions of said first photoresist mask;

forming first conducting plugs in said first contact openings;

depositing and planarizing a third insulating layer over said capacitors;

using a second photoresist mask and anisotropic plasma etching to etch second contact openings in said third insulating layer over and to said first conducting plugs;

forming second conducting plugs in said second contact openings to complete said electrical contacts for said DRAMs.

2. The method of claim 1, wherein said first polysilicon layer is deposited to a thickness of between about 750 and 1250 Angstroms and is doped with an N type conductive dopant to a concentration of between about 1.0 E 20 and 1.0 E 21 atoms/cm$^3$.

3. The method of claim 1, wherein said first hard mask layer is silicon nitride and is deposited to a thickness of between about 1500 and 2500 Angstroms.

4. The method of claim 1, wherein said first insulating layer is silicon oxide and is planarized by chemical/mechanical polishing to have a thickness of between about 2000 and 3000 Angstroms over said FETs.

5. The method of claim 1, wherein said second polysilicon is deposited to a thickness of between about 4000 and 5000 Angstroms and is in-situ doped with an N type conductive dopant to a concentration of between about 1.0 E 18 and 1.0 E 20 atoms/cm$^3$.

6. The method of claim 1, wherein said third polysilicon is deposited a thickness of between about 1000 and 2000 Angstroms and is doped with an N type dopant to a concentration of between about 1.0 E 20 and 1.0 E 21 atoms/cm$^3$.

7. The method of claim 1, wherein said interelectrode dielectric layer is a material selected from the group that includes silicon oxide/silicon nitride/silicon oxide (ONO), tantalum pentoxide, and barium strontium titanium oxide (BaSr)TiO$_3$.

8. The method of claim 1, wherein said fourth polysilicon layer is doped with an N type dopant and is conformally deposited to a thickness of between about 750 and 1250 Angstroms.

9. The method of claim 1, wherein said second insulating layer is silicon oxide deposited conformally to a thickness of between about 1500 and 2500 Angstroms.

10. The method of claim 1, wherein said second hard mask layer is silicon nitride and is deposited to a thickness of between about 1500 and 2500 Angstroms.

11. The method of claim 1, wherein said first contact openings are etched selectively to said first hard-mask layer using high-density-plasma etching and an etchant gas of $CF_4$, $CHF_3$, and Ar, while said second hard-mask layer protects said capacitors from said etching when said first photoresist mask is etched off said capacitors.

12. The method of claim 1, wherein said first hard-mask layer in said first contact openings is plasma etched using high-density-plasma etching and an etchant gas mixture of $CF_4$ and $CHF_3$.

13. The method of claim 1, wherein said first conducting plugs are formed by depositing a barrier layer of titanium and titanium nitride and a chemical-vapor-deposited tungsten layer that is etched back to said first insulating layer.

14. The method of claim 1, wherein said third insulating layer is silicon oxide deposited by chemical vapor deposition and planarized to have a thickness of between about 2000 and 4000 Angstroms over said capacitors.

15. The method of claim 1, wherein said second conducting plugs are formed by depositing an adhesion/barrier layer of titanium and titanium nitride and a chemical-vapor-deposited tungsten layer that is etched back to said third insulating layer.

16. A method for fabricating electrical contacts for dynamic random access memory (DRAM) devices on a semiconductor substrate comprising the steps of:

providing said semiconductor substrate having device areas for memory cells surrounded and electrically isolated from each other by field oxide areas;

depositing a first polysilicon layer on said substrate;

depositing a first hard-mask layer composed of silicon nitride on said first polysilicon layer;

patterning said first hard mask layer and said first polysilicon layer to form field effect transistor (FET) gate electrodes over said device areas and to form word lines over said field oxide areas, where said FETs include source/drain areas and sidewall spacers on said gate electrodes;

depositing a first insulating layer on said substrate and over said FETs, and planarizing said first insulating layer;

etching capacitor node contact openings in said first insulating layer to said source/drain areas;

depositing a second polysilicon layer and polishing back to form polysilicon plugs in said capacitor node contact openings;

depositing a third polysilicon layer and patterning to form capacitor bottom electrodes over and contacting said polysilicon plugs;

forming an interelectrode dielectric layer on said bottom electrodes;

depositing a fourth polysilicon layer, a second insulating layer, and a second hard-mask layer composed of silicon nitride;

patterning said second hard-mask layer, said second insulating layer, and said fourth polysilicon layer to form capacitor top electrodes, while exposing said first insulating layer over said word lines on said field oxide areas;

using a first photoresist mask that is sufficiently thin to provide high resolution patterns for etching first contact openings, and using anisotropic plasma etching to etch said first contact openings in said first insulating layer to said first hard mask, while said second hard-mask layer protects said capacitors from etching;

etching said first hard-mask layer in said first contact openings to said word lines, while said second hard-mask layer is etched selectively to said second insulating layer;

removing remaining portions of said first photoresist mask;

forming first conducting plugs composed of tungsten in said first contact openings;

depositing and planarizing a third insulating layer over said capacitors;

using a second photoresist mask and anisotropic plasma etching to etch second contact openings in said third insulating layer over and to said first conducting plugs;

forming second conducting plugs composed of tungsten in said second contact openings to complete said electrical contacts for said DRAMs.

17. The method of claim 16, wherein said first polysilicon layer is deposited to a thickness of between about 750 and 1250 Angstroms and is doped with an N type conductive dopant to a concentration of between about 1.0 E 20 and 1.0 E 21 atoms/cm$^3$.

18. The method of claim 16, wherein said first hard mask layer is deposited to a thickness of between about 1500 and 2500 Angstroms.

19. The method of claim 16, wherein said first insulating layer is silicon oxide and is planarized by chemical/mechanical polishing to have a thickness of between about 2000 and 3000 Angstroms over said FETs.

20. The method of claim 16, wherein said second polysilicon is deposited to a thickness of between about 4000 and 5000 Angstroms and is in-situ doped with an N type conductive dopant to a concentration of between about 1.0 E 18 and 1.0 E 20 atoms/cm$^3$.

21. The method of claim 16, wherein said third polysilicon is deposited a thickness of between about 1000 and 2000 Angstroms and is doped with an N type dopant to a concentration of between about 1.0 E 20 and 1.0 E 21 atoms/cm$^3$.

22. The method of claim 16, wherein said interelectrode dielectric layer is a material selected from the group that includes silicon oxide/silicon nitride/silicon oxide (ONO), tantalum pentoxide, and barium strontium titanium oxide (BaSr)TiO$_3$.

23. The method of claim 16, wherein said fourth polysilicon layer is doped with an N type dopant and is conformally deposited to a thickness of between about 750 and 1250 Angstroms.

24. The method of claim 16, wherein said second insulating layer is silicon oxide deposited conformally to a thickness of between about 1500 and 2500 Angstroms.

25. The method of claim 16, wherein said second hard mask layer is deposited to a thickness of between about 1500 and 2500 Angstroms.

26. The method of claim 16, wherein said first contact openings are etched selectively to said first hard-mask layer using high-density-plasma etching and an etchant gas of $CF_4$, $CHF_3$, and Ar, while said second hard-mask layer protects said capacitors from said etching when said first photoresist mask is etched off said capacitors.

27. The method of claim 16, wherein said first hard-mask layer in said first contact openings is plasma etched using high-density-plasma etching and an etchant gas mixture of $CF_4$ and $CHF_3$.

28. The method of claim 16, wherein said first conducting plugs are formed by depositing a barrier layer of titanium and titanium nitride and by depositing a tungsten layer by chemical vapor deposition and etching back to said first insulating layer.

29. The method of claim 16, wherein said third insulating layer is silicon oxide deposited by chemical vapor deposition and planarized to have a thickness of between about 2000 and 4000 Angstroms over said capacitors.

30. The method of claim 16, wherein said second conducting plugs are formed by depositing an adhesion/barrier layer of titanium and titanium nitride and by depositing a tungsten layer by chemical vapor deposition, and etching back to said third insulating layer.

* * * * *